(12) United States Patent
Sitaram et al.

(10) Patent No.: US 6,844,581 B2
(45) Date of Patent: Jan. 18, 2005

(54) STORAGE CAPACITOR AND ASSOCIATED CONTACT-MAKING STRUCTURE AND A METHOD FOR FABRICATING THE STORAGE CAPACITOR AND THE CONTACT-MAKING STRUCTURE

(75) Inventors: Arkalgud Sitaram, Fishkill, NY (US); Christine Dehm, Nürnberg (DE); Carlos Mazuré-Espejo, St. Nazaire les Eymes (FR)

(73) Assignee: Infineon Technologies AG, Munich (DE)

(*) Notice: Subject to any disclaimer, the term of this patent is extended or adjusted under 35 U.S.C. 154(b) by 0 days.

(21) Appl. No.: 10/012,168

(22) Filed: Oct. 26, 2001

(65) Prior Publication Data

US 2002/0066921 A1 Jun. 6, 2002

(30) Foreign Application Priority Data

Oct. 26, 2000 (DE) ......... 100 53 170

(51) Int. Cl.[7] ......... H01L 29/76; H01L 29/94; H01L 31/062; H01L 31/113; H01L 31/119
(52) U.S. Cl. ......... 257/295; 257/296; 257/301
(58) Field of Search ......... 257/296, 300, 257/303, 306, 532, 295, 301, 304, 308, 310; 438/239, 244, 250, 253, 393, 396, 397, 398

(56) References Cited

U.S. PATENT DOCUMENTS

| | | | |
|---|---|---|---|
| 5,760,474 A | * 6/1998 | Schuele | 257/754 |
| 5,828,092 A | 10/1998 | Tempel | |
| 6,083,765 A | 7/2000 | Tempel | 438/3 |
| 6,344,965 B1 | * 2/2002 | Roh | 361/311 |
| 6,462,931 B1 | * 10/2002 | Tang et al. | 361/305 |

FOREIGN PATENT DOCUMENTS

| | | |
|---|---|---|
| DE | 196 40 448 C 1 | 2/1998 |
| EP | 0 991 117 A2 | 4/2000 |
| EP | 1 022 783 A2 | 7/2000 |
| WO | 00/14796 | 3/2000 |

OTHER PUBLICATIONS

Shaohong Kuah et al.: "Interaction Of Ir And $IrO_2$ Thin Films With Polysilicon, W And $WSI_x$", *Integrated Ferroelectrics*, 1997, vol. 17, pp. 479–488.
Seon Yong Cha et al.: "Deoxidization of Iridium Oxide Thin Film", *Jpn. J. Appl. Phys.*, vol. 38, 1999, pp. L1128–L1130.
Wolfgang Hönlein: "Neue Dielektrika für Gbit–Speicherchips" (New Dielectric for Gbit Memory Chips), Phys. Bl. 55, No. 2, 1999, published by Wiley–VCH Verlag GmbH, pp. 51–53.
D. Widmann et al.: „ Technologie hochintegrierter Schaltungen (Technology of High Integrated Circuits), Edition 2, Springer–Publishing–House, Chapter 8.4.2 „Aufbau von dynamischen Speicherzellen (Structure of Dynamic Memory Cells).

* cited by examiner

*Primary Examiner*—Hoai Pham
(74) *Attorney, Agent, or Firm*—Laurence A. Greenberg; Werner H. Stemer; Gregory L. Mayback

(57) ABSTRACT

A storage capacitor, in particular a ferroelectric or paraelectric storage capacitor, and an associated contact-making structure are formed in such a way that the storage capacitor has a first electrode layer, a second electrode layer and a dielectric, ferroelectric or paraelectric capacitor intermediate layer. Proceeding from the plane of the surface of the insulation layer, the storage capacitor extends at least partly into the interior of the via contact and is electrically connected to the via contact.

4 Claims, 2 Drawing Sheets

STORAGE CAPACITOR AND ASSOCIATED CONTACT-MAKING STRUCTURE AND A METHOD FOR FABRICATING THE STORAGE CAPACITOR AND THE CONTACT-MAKING STRUCTURE

BACKGROUND OF THE INVENTION

Field of the Invention

The invention generally relates to the field of storage capacitors of the kind used in very large scale integrated memory components such as DRAM (Dynamic Random Access Memory) semiconductor memory components. In particular, the invention relates to those memory components whose storage capacitor is designed as a so-called stacked capacitor. In a memory component of this type, the storage capacitor and the selection transistor that drives it are essentially arranged one above the other and are isolated from one another by an insulation layer. A via contact is formed in the insulation layer for making electrical contact between the selection transistor and the storage capacitor. In this case, the invention relates in particular, but not exclusively, to ferroelectric or paraelectric storage capacitors. Moreover, the invention relates to methods for fabricating memory components and the storage capacitors and the associated contact structures contained in them.

The dynamic semiconductor components (DRAMs) fabricated in microelectronics essentially include a selection or switching transistor and a storage capacitor in which a dielectric material is inserted between two capacitor plates. Oxide or nitride layers having a relative permittivity of about at most 8 are usually mostly used as a dielectric. In order to reduce the size of the storage capacitor and also in order to fabricate nonvolatile memories, "novel" capacitor materials, such as, for example, ferroelectric or paraelectric materials with significantly higher relative permitivities, are required. Some of these materials are mentioned in the publication "Neue Dielektrika für Gbit-Speicherchips" [New dielectrics for Gbit memory chips] by W. Hönlein, Phys. Bl. 55 (1999). In order to fabricate ferroelectric capacitors for use in such nonvolatile semiconductor memory components having a high integration density, it is possible to use e.g. ferroelectric materials, such as $SrBi_2(Ta,Nb)_2O_9$ (SBT or SBTN), $Pb(Zr,Ti)O_3$ (PZT), or $Bi_4Ti_3O_{12}$ (BTO) as a dielectric between the capacitor plates. However, it is also possible to use a paraelectric material, such as $(BaSr)TiO_3$ (BST), for example. When ferroelectric materials are discussed below, this is intended equally to encompass paraelectric materials.

The use of ferroelectric materials for storage capacitors presents the semiconductor process technology with new challenges. This is because these novel materials can no longer be combined with polysilicon, the traditional electrode material. The reason for this is that after the deposition of the ferroelectric material, the latter has to be subjected to heat treatment ("conditioned"), if appropriate, a number of times in an oxygen-containing atmosphere at temperatures of about 550–800° C. In order to avoid undesirable chemical reactions between the ferroelectric material and the electrodes, sufficiently thermostable and inert electrode materials must be used, such as, for example, platinum-group metals, i.e. Pt, Pd, Ir, Rh, Ru or Os, the conductive oxides thereof (e.g. $RuO_2$), or other conductive oxides such as LaSrCoOx or $SrRuO_3$.

FIG. 1 diagrammatically illustrates a cross-sectional view of a conventional DRAM memory cell according to the concept of a stacked cell. In this construction of the memory cell, the switching transistor 2 and the storage capacitor 3 are essentially arranged directly above one another. The bottom electrode 32 of the storage capacitor 3 is electrically connected to the drain region 21 of the MOS transistor 2 by a via contact 41 ("plug") which is filled with a filling plug (41a) made of electrically conductive material and is etched through an insulation layer 4.

On a semiconductor substrate 1, first a MOS transistor 2 is fabricated by forming a drain region 21 and a source region 23 by doping. There is a channel between these regions whose conductivity can be controlled by a gate 22 arranged above the channel. The gate 22 may be formed by a word line WL of the memory component or may be connected to the word line. The source region 23 is connected to a bit line BL of the memory component by a via contact 52.

The MOS transistor 2 is subsequently covered with a planarizing insulation layer 4, for example with an oxide, such as $SiO_2$.

A storage capacitor 3 is formed on the insulation layer 4 as follows: first of all a bottom electrode layer 32 is applied and patterned. The bottom electrode layer 32 is electrically connected to the drain region 21 of the MOS transistor 2 by the via contact 41. A metal-oxide-containing capacitor intermediate layer 33 of a ferroelectric material, which forms the capacitor material, is then deposited onto the bottom electrode layer 32. A top electrode layer 34 is deposited over the whole area of the layer 33 and is patterned.

Finally, the obtained structure is again covered by a second planarizing insulation layer 5, for example an oxide layer, such as $SiO_2$. A further via contact 51 is made in the layer, through which contact the top electrode 34 of the storage capacitor 3 can be connected to an external electrical terminal P (common capacitor plate) by means of a suitable conductive material.

The source region 23 of the MOS transistor 2 is thereby connected to the bit line BL as follows: the via contact 52 extending through the two insulation layers 4 and 5 is formed and filled with a conductive material, such as polycrystalline silicon.

The advancing integration density in memory components has the consequence of correspondingly reducing the area available per memory component. On the other hand, there is the requirement to obtain a sufficiently large read signal from the memory cell. Therefore, in the prior art, further designs of the stacked capacitor have been developed which have obtained an increased storage capacitance while the area requirement has remained the same.

These components are described in the book "Technologie hochintegrierter Schaltungen" [Technology of large scale integrated circuits] by D. Widmann, H. Mader and H. Friedrich, published by Springer-Verlag, 2nd edition (ISBN 3-540-593578), in section 8.4.2 "Construction of dynamic memory cells", and are illustrated in FIGS. 8.4.3c and d, where they are designated as the "Crown stacked capacitor" and the "Rough silicon stacked capacitor". Their concept is essentially based on forming a capacitor intermediate layer that is multiply folded in the vertical direction. This increases the storage capacitance, without laterally enlarging the memory component. However, as can easily be discerned from the abovementioned figures, the disadvantage of this concept resides in the increase in the stack height of the components.

SUMMARY OF THE INVENTION

It is accordingly an object of the invention to provide a storage capacitor and a contact-making structure and a method for fabricating the storage capacitor and the contact-making structure which overcomes the above-mentioned disadvantages of the prior art apparatus and methods of this general type. More specifically, it is an object of the invention to provide a storage capacitor, in particular a ferroelectric or paraelectric storage capacitor, and an associated contact-making structure so that an increased storage capacitance is obtained without increasing the required lateral and vertical structural dimensions.

With the foregoing and other objects in view there is provided, in accordance with the invention, a configuration having a storage capacitor and an associated contact-making structure. An insulation layer is provided that has a via contact formed therein. The via contact has an interior and forms a contact-making structure. The insulation layer has a surface defining a plane. The storage capacitor has a first electrode layer, a second electrode layer, and a capacitor intermediate layer selected from the group consisting of a ferroelectric dielectric layer and a paraelectric dielectric layer. Proceeding from the plane of the surface of the insulation layer, the storage capacitor extends at least partly into the interior of the via contact and is electrically connected to the via contact.

In accordance with an added feature of the invention, the storage capacitor has a folded capacitor section in the interior of the via contact; and the folded capacitor section is selected from the group consisting of a singly folded capacitor section and a multiply folded capacitor section.

In accordance with an additional feature of the invention, the folded capacitor section is singly folded; and in the folded capacitor section, the first electrode layer faces the interior of the via contact and is electrically connected to the via contact.

In accordance with another feature of the invention, in the folded capacitor section, the first electrode layer has a first section and two essentially parallel sections that run along the via contact. The parallel sections have ends that are connected by the first section. In the folded capacitor section, the capacitor intermediate layer has a second section and two essentially parallel sections that run along the via contact. In addition, the parallel sections of the capacitor intermediate layer have ends that are connected by the second section.

In accordance with a further feature of the invention, the parallel sections of the capacitor intermediate layer define a gap therebetween. Additionally, in the folded capacitor section, the second electrode layer has a section that runs along the via contact and that fills the gap.

In accordance with a further added feature of the invention, the via contact includes an electrically conductive contact layer. At least one section selected from the group consisting of one of the parallel sections of the first electrode layer and the first section of the first electrode layer is connected to the electrically conductive contact layer of the via contact.

In accordance with a further additional feature of the invention, the via contact contains a filling plug made of an electrically conductive material, and the filling plug is set back from the plane of the surface of the insulation layer.

In accordance with yet an added feature of the invention, there is provided, at least one electrically conductive contact layer which is located in the via contact and outside the filling plug and which is electrically connected to the storage capacitor and to the filling plug.

In accordance with yet an additional feature of the invention, the via contact is formed with opposite inner walls; the conductive contact layer includes two contact layers; and each one of the two contact layers is located on a respective one of the inner walls.

In accordance with yet another feature of the invention, there is provided, at least one conductive layer that is deposited on the filling plug. The conductive layer is made of material that is different from the material of the filling plug.

In accordance with an added feature of the invention, the at least one conductive layer includes a first conductive intermediate layer and a second conductive oxygen barrier layer that are deposited on the filling plug.

In accordance with an additional feature of the invention, the via contact is formed with opposite inner walls; the at least one layer includes two sections configured on the opposite inner walls of the via contact; the at least one layer includes a connecting section that connects the two sections of the at least one layer; and the connecting section is configured on the filling plug.

In accordance with another feature of the invention, a barrier layer is deposited on the at least one conductive layer so that the at least one conductive layer is completely surrounded by the filling plug, the insulation layer, and the barrier layer.

The invention is essentially based on the concept of forming the storage capacitor in such a way that a section thereof extends into the via contact with which electrical contact is made with the storage capacitor. This via contact is made in an insulation layer having a side on which the storage capacitor is arranged. The via contact may, for example, be connected to a switching transistor arranged on the other side of the insulation layer.

The invention thus provides a three-dimensional extension of the storage capacitor, but without enlarging the stack height of the component in the process. Rather, the stacked capacitor extends into a spatial region that has to be provided in the component anyway. Consequently, it is not necessary to provide additional space for the three-dimensional extent of the stacked capacitor.

Consequently, whereas in the prior art the stacked capacitor is applied on a flat, planarized surface of the insulation layer containing the contact-making structure, in the case of the invention a stacked capacitor is formed in such a way that, proceeding from the plane of the surface of the insulation layer, it at least partly extends into the interior of the via contact and is electrically connected to the via contact.

In a simple embodiment, the stacked capacitor is singly folded in the section that extends into the interior of the via contact, i.e., it has a structure with two sections parallel to the via contact and a section that connects the sections at their ends. However, it is equally possible for the stacked capacitor to be multiply folded in the section, the singly folded structure described being multiply joined together.

The storage capacitor preferably has, in an intrinsically customary manner, a first electrode layer, a second electrode layer and a dielectric, ferroelectric or paraelectric capacitor intermediate layer and normally one of the two electrode layers, for example, the first electrode layer, in the folded section, faces the interior of the via contact and is electrically connected to the via contact, or to electrically conductive material present in the via contact.

In the folded capacitor section, the first electrode layer and the capacitor intermediate layer may in each case have two essentially parallel sections running along the via contact and a section that connects these sections at their ends.

The second electrode layer may then be configured such that, in the folded capacitor section, it only fills the gap between the two vertical sections of the capacitor intermediate layer.

The storage capacitor is preferably formed in such a way that, in addition to the folded section extending into the interior of the via contact, it additionally has one or more sections arranged in a planar manner on the surface of the insulation layer.

With regard to the contact-connection of the storage capacitor within the via contact, preferably the first electrode layer is connected to the electrically conductive material of the via contact at all three sections. In principle, however, it suffices for the layer to be correspondingly electrically contact-connected at, at least one of its sections.

The via contact may be configured such that it contains a filling plug made of electrically conductive material, for example, doped polycrystalline silicon, which plug is set back from the plane of the surface of the insulation layer. If desired, further electrically conductive contact layers may be applied on the plug. The horizontal section of the storage capacitor may bear on the layers or directly on the filling plug.

However, it is also possible for one or a plurality of electrically conductive contact layers to be deposited on the set-back filling plug or patterned in such a way that they have a box-shaped structure with two parallel sections running along the direction of the via contact and a section that connects the sections. These sections may encompass the first electrode layer of the storage capacitor, thereby producing optimum electrical contact.

Such a structure may also be fabricated using a single electrically conductive material. In this case, the via opening made in the insulation layer is filled with at least one conductive material, for instance polycrystalline silicon, in such a way as to leave an outwardly open cavity free of conductive material, and afterward a storage capacitor is at least partly deposited into the cavity.

With the foregoing and other objects in view there is provided, in accordance with the invention, a method for fabricating the storage capacitor and a contact-making structure for contact-connecting the storage capacitor to a switching transistor. The simplest way to fabricate the cavity is as follows: the via opening is not entirely filled with the electrically conductive material and the cavity is formed by the unfilled section of the via opening. The via opening may also be completely filled with the conductive material and afterward the cavity may be produced by making a recess of predetermined depth in the conductive material, for example, using an etching step. In this case, the entire width of the material of the via contact can be completely removed down to the predetermined depth. However, it is also possible for opposite side walls to remain, resulting in a box-shaped structure, as has already been described above, which can encompass the storage capacitor in a suitable manner.

It is also possible to only partially fill the via opening with a first conductive material. Afterward, a second conductive material may be filled into the remaining section of the via opening. Afterward, the recess may be made in the second conductive material as described.

If desired, before the second conductive material is filled in, an intermediate layer of a third conductive material may be formed on the surface of the first conductive material. Such a structure is particularly suitable in ferroelectric storage capacitors in which the intermediate layer is formed by a Ti and/or TiN layer and the second conductive material forms an oxygen barrier layer, for example made of IR or IrO. This last-mentioned layer is intended to prevent the situation in which, during the fabrication of the capacitor, in the event of a thermal oxidation or the like, oxygen penetrates as far as the polycrystalline silicon of the via contact and forms an electrically insulating $SiO_2$ layer at the surface. In this case, iridium (Ir) or iridium oxide (IrO) has the advantage that it can absorb oxygen without appreciably losing its electrical conductivity. The underlying Ti intermediate layer serves as a suitable transition layer since, on the one hand, it forms a low-impedance titanium silicide depletion layer with the polycrystalline silicon, and on the other hand, it constitutes a suitable nucleation layer for the Ir layer. In principle, these layers may also be formed from other materials, but they must always be electrically conductive.

In a particularly preferred embodiment, in the case when using an oxygen barrier layer (just described) and a suitable intermediate layer, the barrier layer is deposited on the intermediate layer in such a way that the intermediate layer is completely surrounded by the underlying filling plug, the insulation layer, which is situated laterally thereto, and the barrier layer. This effectively prevents the situation in which the intermediate layer, usually made of titanium, forms a thin oxide layer on its surface during a thermal oxidation step, as is carried out during the conditioning of the ferroelectric layer.

With the foregoing and other objects in view, in accordance with the invention, the storage capacitor with the associated contact-making structure may be part of a memory component in which a switching transistor is formed on a substrate, such as a semiconductor substrate, an insulation layer is applied on the switching transistor and the contact-making structure and the storage capacitor are formed in and on the insulation layer.

Other features which are considered as characteristic for the invention are set forth in the appended claims.

Although the invention is illustrated and described herein as embodied in storage capacitor and associated contact-making structure and also method for the fabrication thereof, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The exemplary embodiment described below relates to a storage capacitor with a ferroelectric capacitor intermediate layer. However, the invention can equally be applied to storage capacitors with conventional dielectrics.

Figure 1:
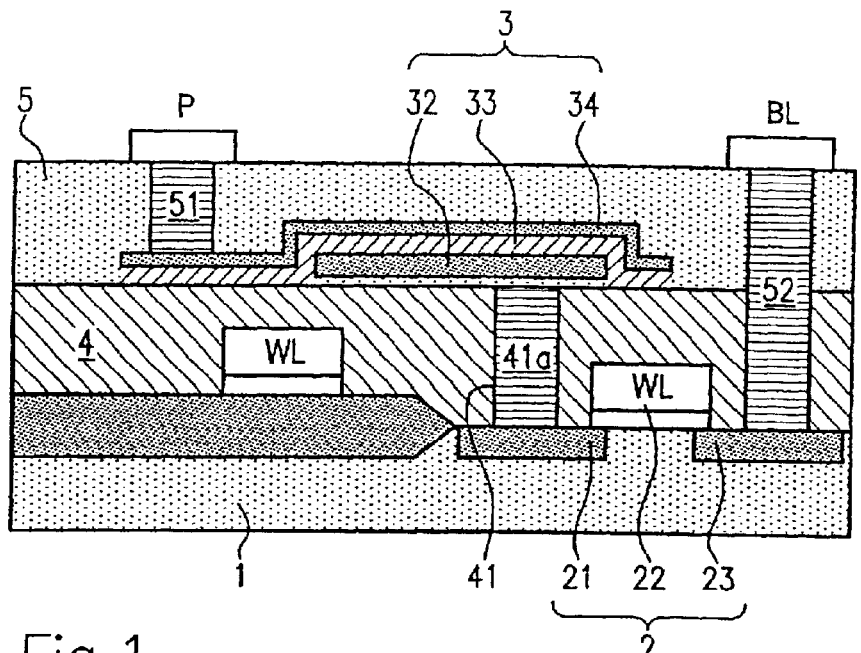
FIG. 1 shows a cross-sectional view of a prior art DRAM memory cell having a ferroelectric stacked capacitor.
Figures 2A, 2B:
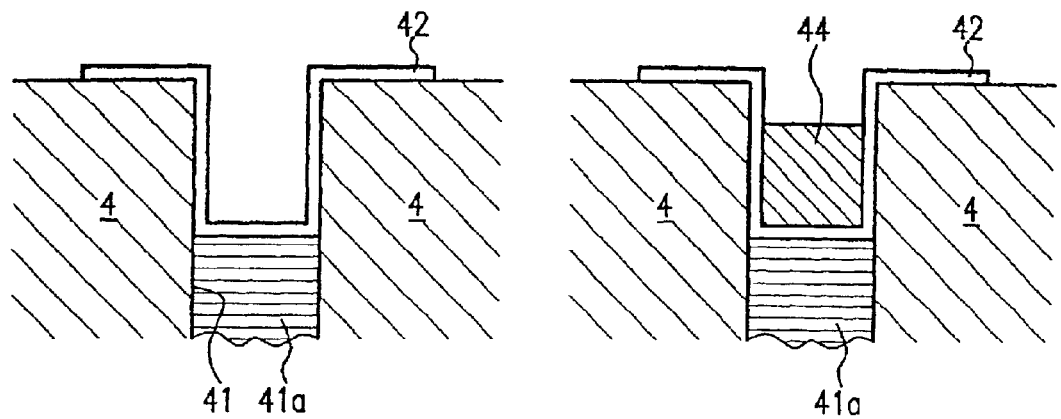
FIGS. 2A–H show an exemplary embodiment of a method for fabricating a storage capacitor having a contact-making structure.

Referring now to the figures of the drawing in detail and first, particularly, to FIG. 2A thereof, there is shown a cross sectional view of an upper section of a via contact 41 that has been made in the insulation layer 4. Situated below the insulation layer 4 there may be, for example, an already completed switching transistor whose drain or source terminal is connected to the via contact.

The via contact is filled up to a predetermined level with a filling plug 41a made of doped polycrystalline silicon. This structure is usually fabricated in such a way that the via contact 41 is first completely filled with polysilicon and is then partly removed by means of an etching step. An intermediate layer 42 including a Ti, TiN or Ti/TiN double layer is then deposited, so that this layer 42 covers two opposite inner walls in this upper section of the via contact 41 and covers an edge section on the upper surface of the insulation layer 4 near both sides of the via contact 41. The intermediate layer 42 thus forms a box-shaped structure in which, however, the inner walls of the via opening which lie parallel to the plane of the drawing are not provided with the intermediate layer 42.

In accordance with FIG. 2B, the via contact 41 is then filled up to a specific level with a photoresist layer 44. This photoresist layer 44 serves as a masking layer for a subsequent etching step for the selective removal of the intermediate layer 42. In this etching step, those sections of the intermediate layer 42 which are not covered by the photoresist layer 44 are then removed.

Figure 2C:
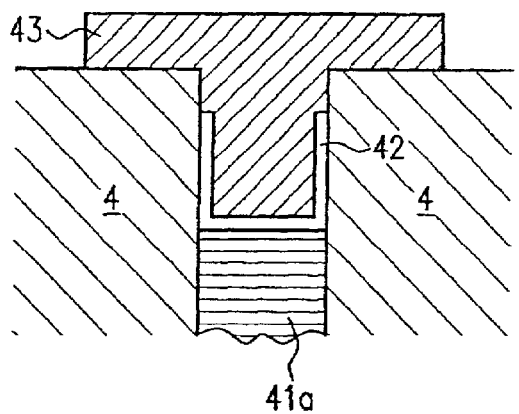
Figure 2D:
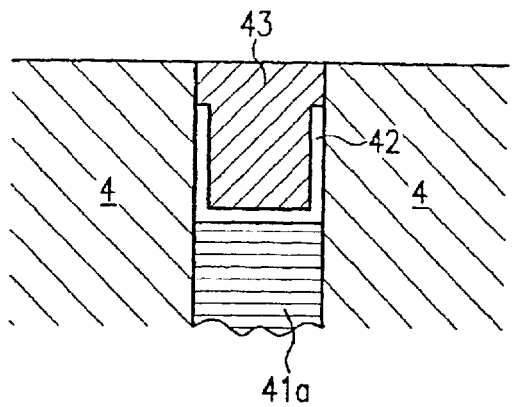

After the removal of these sections of the intermediate layer 42, in accordance with FIG. 2C, an oxygen barrier layer 43, for example made of Ir or IrO, is then deposited into the via opening and onto a surface section of the insulation layer 4. The latter part of the barrier layer 43 which projects on the surface of the insulation layer 4 can be removed by means of a CMP (Chemical Mechanical Polishing) process, resulting in the structure shown in FIG. 2D.

Consequently, the intermediate layer 42 does not reach as far as the surface of the structure, but rather is set back by a short distance into the depth of the structure. This distance is determined by the level of the photoresist layer 44 deposited in accordance with FIG. 2B. This distance effectively prevents the situation in which oxygen atoms, which defuse into deeper regions of the structure for example during a heat treatment process on the ferroelectric layer, penetrate into the intermediate layer 42 and form an electrically insulating oxide layer on its surface.

Figure 2E:
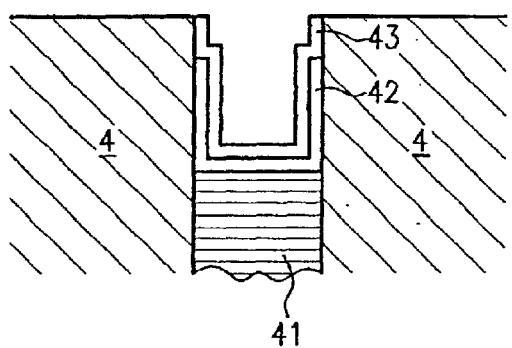

In accordance with FIG. 2E, and, if appropriate a two-stage anisotropic etching process is then carried out on the barrier layer 43, during which the material of the barrier layer 43 is removed except for a box-shaped structure corresponding to the box-shaped structure of the intermediate layer 42. This results in a contact-making structure into which the storage capacitor can be deposited.

Figure 2F:
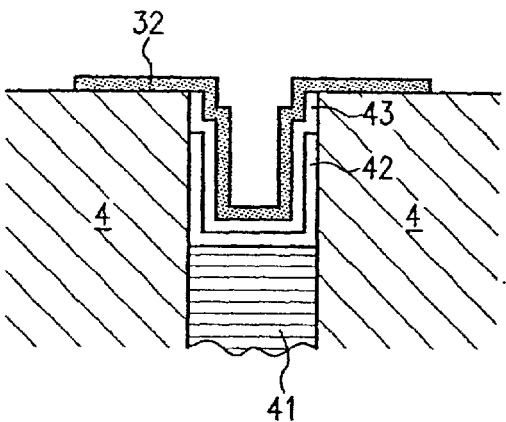

In accordance with FIG. 2F, a first electrode layer 32 of the storage capacitor 3 is deposited, which layer may be composed of platinum, for example. It is deposited into the via opening in such a way that, like the layers 42 and 43 surrounding it, it has a box-shaped structure with two vertical, opposite sections and a horizontal section connecting the sections at the bottom.

Figure 2G:
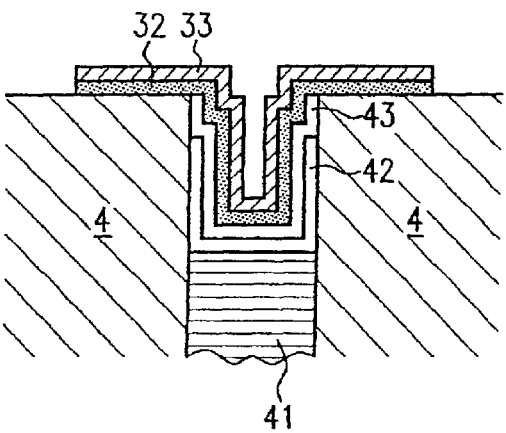

In exactly the same manner, a ferroelectric capacitor intermediate layer 33 is then applied to the first electrode layer 32, as shown in FIG. 2G. This ferroelectric layer may be thermally treated ("conditioned") immediately after it has been applied. If appropriate, however, this process step can also be carried out at a later time during the component fabrication process.

Figure 2H:
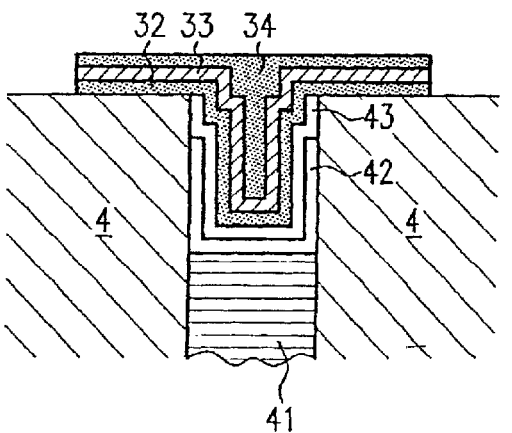

In a final step for fabricating the storage capacitor, in accordance with FIG. 2H, the second electrode layer 34 is then applied to the capacitor intermediate layer 33. The second electrode layer 34 is preferably produced from the same material as the first electrode layer 32, and so it is thus composed of platinum in the example chosen. It can be deposited relatively simply in such a way that it covers the capacitor intermediate layer 33 on the horizontal sections, and in the vertical section, fills the interspace between the vertical sections of the capacitor intermediate layer 33.

Consequently, a storage capacitor has been completed which, by utilizing a spatial region of the via contact, has an enlarged storage capacitance without necessitating an increase in the stack height.

We claim:

1. A storage capacitor and an associated contact-making structure, which comprises:

an insulation layer having a via contact formed therein, said via contact having an interior and forming a contact-making structure, said insulation layer having a surface defining a plane;

a storage capacitor having a first electrode layer, a second electrode layer, and a capacitor intermediate layer, said capacitor intermediate layer selected from the group consisting of a ferroelectric dielectric layer and a paraelectric dielectric layer;

proceeding from the plane of said surface of said insulation layer, said storage capacitor extending at least partly into said interior of said via contact and being electrically connected to said via contact;

a filling plug made of an electrically insulating material and provided in said via contact for setting said filling plug back from the plane of said surface of said insulation layer;

a first electrically conductive layer formed on the upper surface of said filling plug and on side walls of said via contact for setting said first conductive layer back from the plane of said surface of said insulation layer; and a second electrically conductive layer functioning as an oxygen barrier and formed on said first electrically conductive layer causing the upper surface of said second electrically conductive layer to be in one plane with the plane of said surface of said insulation layer and placing the surface of said second electrically conductive layer in electrical contact with the surface of said first electrode layer of said storage capacitor, for completely surrounding said first electrically conductive layer with said filling plug, said insulation layer, and said second electrically conductive layer.

2. A memory component, comprising:

a substrate;

a switching transistor formed on said substrate;

an insulation layer applied on said switching transistor, said insulation layer having a via contact formed therein, said via contact having an interior and forming a contact-making structure, said insulation layer having a surface defining a plane;

a storage capacitor having a first electrode layer, a second electrode layer, and a capacitor intermediate layer selected from the group consisting of a ferroelectric dielectric layer and a paraelectric dielectric layer;

said storage capacitor extending proceeding from the plane of said surface of said insulation layer at least partly into said interior of said via contact and being electrically connected to said via contact;

a filling plug made of an electrically insulating material and provided in said via contact for setting said filling plug back from the plane of said surface of said insulation layer;

a first electrically conductive layer formed on the upper surface of said filling plug and on side walls of said via contact for setting said first conductive layer back from the plane of said surface of said insulation layer; and a second electrically conductive layer functioning as an oxygen barrier and formed on said first electrically conductive layer causing the upper surface of said second electrically conductive layer to be in one plane with the plane of said surface of said insulation layer and placing the surface of said second electrically conductive layer in electrical contact with the surface of said first electrode layer of said storage capacitor, for completely surrounding said first electrically conductive layer with said filling plug, said insulation layer, and said second electrically conductive layer.

3. The storage capacitor and the contact-making structure according to claim 1, wherein said second electrically conductive layer contains Ir or IrO.

4. The storage capacitor and the contact-making structure according to claim 1, wherein said first electrically conductive layer is made of a Ti layer, a TiN layer or a Ti/TiN double layer.

* * * * *